(12) United States Patent
Otsuka et al.

(10) Patent No.: US 9,635,293 B2
(45) Date of Patent: Apr. 25, 2017

(54) SOLID-STATE IMAGING DEVICE

(71) Applicant: HAMAMATSU PHOTONICS K.K., Hamamatsu-shi, Shizuoka (JP)

(72) Inventors: Shinya Otsuka, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/774,141

(22) PCT Filed: Feb. 18, 2014

(86) PCT No.: PCT/JP2014/053789
§ 371 (c)(1),
(2) Date: Sep. 10, 2015

(87) PCT Pub. No.: WO2014/141826
PCT Pub. Date: Sep. 18, 2014

(65) Prior Publication Data
US 2016/0044260 A1   Feb. 11, 2016

(30) Foreign Application Priority Data
Mar. 15, 2013 (JP) ................. 2013-053521

(51) Int. Cl.
*H04N 5/372* (2011.01)
*H04N 5/378* (2011.01)
(Continued)

(52) U.S. Cl.
CPC ....... *H04N 5/372* (2013.01); *H01L 27/14812* (2013.01); *H04N 5/378* (2013.01); *H04N 5/3725* (2013.01); *H04N 5/37213* (2013.01)

(58) Field of Classification Search
CPC .... H04N 5/372; H04N 5/37812; H04N 5/371; H04N 5/37213; H04N 5/3725;
(Continued)

(56) References Cited

U.S. PATENT DOCUMENTS

| 5,309,240 A * | 5/1994 | Miwada ............ H01L 27/14825 257/241 |
| 5,500,675 A * | 3/1996 | Arakawa ............ H04N 5/37213 250/208.1 |
| 2005/0224842 A1 | 10/2005 | Toyama |

FOREIGN PATENT DOCUMENTS

| JP | H01-255273 A | 10/1989 |
| JP | H06-276441 A | 9/1994 |

(Continued)

OTHER PUBLICATIONS

Kosonocky, W.F., et al., "Two-Phase Charge-Coupled Devices with Overlapping Polysilicon and Aluminum Gates," RCA Review, vol. 34, No. 163, Mar. 1973, p. 165, XP001288063.

*Primary Examiner* — Tuan Ho
*Assistant Examiner* — Marly Camargo
(74) *Attorney, Agent, or Firm* — Drinker Biddle & Reath LLP

(57) ABSTRACT

A solid-state imaging device includes photoelectric converting sections transfer sections first buffer sections second buffer sections first output sections, and second output sections. The photoelectric converting sections generate electric charges in response to incidence of light. The transfer sections transfer the generated electric charges in a first direction or in a second direction opposite thereto in response to three-phase or four-phase drive signals. The first buffer sections and the second buffer sections acquire the electric charges transferred in the first and second directions, respectively, by the transfer sections and transfer the acquired electric charges in the first and second directions, (Continued)

respectively, in response to two-phase drive signals. The first output sections and the second output sections acquire the electric charges transferred from the first buffer sections and from the second buffer sections respectively, and output signals according to the acquired electric charges.

5 Claims, 8 Drawing Sheets

(51) Int. Cl.
*H01L 27/148* (2006.01)
*H04N 5/3725* (2011.01)
(58) Field of Classification Search
CPC .... H04N 5/37206; H04N 5/3743; H01L 27/148;
H01L 27/1057; H01L 27/14856
USPC ........ 348/294–325; 250/208.1; 257/291, 292
See application file for complete search history.

(56) References Cited

FOREIGN PATENT DOCUMENTS

| | | |
|---|---|---|
| JP | 2003-051987 A | 2/2003 |
| WO | WO-03/107661 A1 | 12/2003 |
| WO | WO-2007/064910 A2 | 6/2007 |

\* cited by examiner

SOLID-STATE IMAGING DEVICE

TECHNICAL FIELD

The present invention relates to a solid-state imaging device and, more particularly, to a solid-state imaging device capable of transferring electric charges bi-directionally.

BACKGROUND ART

There are known solid-state imaging devices using CCD, which can transfer electric charges bi-directionally in a vertical direction (e.g., cf. Patent Literature 1). In the solid-state imaging device described in Patent Literature 1, three gates are provided per pixel and three-phase voltages of different phases are applied respectively to the three gates. This allows an electric charge generated in response to incidence of light in an imaging area to be moved bi-directionally in the vertical direction. The solid-state imaging device described in Patent Literature 1 is provided with a horizontal shift register for horizontally transferring the electric charge vertically transferred from the imaging area. The electric charge transferred by the horizontal shift register is converted into a voltage signal by a readout amplifier to be read out to the outside of the solid-state imaging device. In the solid-state imaging device described in Patent Literature 1, a plurality of readout amplifiers are provided horizontally in juxtaposition to implement multi-port output, thus realizing speed-up of readout of electric charges. However, when the horizontal shift register is used as in the technology described in Patent Literature 1, there is a limit to the speed-up of readout of electric charges, even with the implementation of multi-port output. There are recent demands for further speed-up of readout of electric charges.

A known technology for further speed-up of readout of electric charges is the technology of providing one output amplifier per two adjacent columns, out of pixel columns arranged in a two-dimensional array, and reading out electric charges with use of this output amplifier (e.g., cf. Patent Literature 2). In the solid-state imaging device described in Patent Literature 2, six-phase drive voltages are applied in an imaging area and a buffer area. The drive voltages control depths of potentials in a semiconductor substrate to transfer the electric charges from the imaging area to the buffer area, and the electric charges thus transferred are read out as voltage signals by the amplifier.

CITATION LIST

Patent Literatures

Patent Literature 1: International Publication WO 2007/064910
Patent Literature 2: International Publication WO 2003/107661

SUMMARY OF INVENTION

Technical Problem

When the technology described in Patent Literature 2 is applied to the solid-state imaging device described in Patent Literature 1, both of the imaging area and the buffer area are driven by the six-phase drive voltages. For transferring the electric charges in the solid-state imaging device of this configuration, it is necessary to change the six-phase voltages in order in each area. Therefore, it takes some time to perform the vertical transfer, which hinders the speed-up of readout of electric charges.

It is an object of the present invention to provide a solid-state imaging device capable of transferring the electric charges bi-directionally and reading out the electric charges at high speed.

Solution to Problem

A solid-state imaging device according to one aspect of the present invention includes a photoelectric converting section provided so as to extend along a first direction and configured to generate an electric charge in response to incidence of light, a transfer section configured to transfer the electric charge generated in the photoelectric converting section, in the first direction or in a second direction opposite to the first direction in response to three-phase or four-phase drive signals, a first buffer section disposed corresponding to the photoelectric converting section and configured to acquire the electric charge transferred in the first direction from the photoelectric converting section by the transfer section and transfer the acquired electric charge in the first direction in response to two-phase drive signals, a second buffer section disposed corresponding to the photoelectric converting section and configured to acquire the electric charge transferred in the second direction from the photoelectric converting section by the transfer section and transfer the acquired electric charge in the second direction in response to two-phase drive signals, a first output section disposed corresponding to the first buffer section and configured to acquire the electric charge transferred from the first buffer section and output a signal according to the acquired electric charge, and a second output section disposed corresponding to the second buffer section and configured to acquire the electric charge transferred from the second buffer section and output a signal according to the acquired electric charge.

In the solid-state imaging device according to the one aspect of the present invention, the electric charge generated in the photoelectric converting section is transferred bi-directionally, in the first direction or the second direction, by the transfer section. The transfer section transfers the electric charge in response to the three-phase or four-phase drive signals and, the first buffer section or the second buffer section each transfers the electric charge in response to the two-phase drive signals. Therefore, the solid-state imaging device according to the one aspect of the present invention can perform the transfer of the electric charge in the first direction or the second direction at high speed. In this manner, the solid-state imaging device according to the one aspect of the present invention can transfer the electric charge bi-directionally and read out the electric charge at high speed.

The transfer section may have a plurality of transfer electrodes disposed in juxtaposition in the first direction and configured to transfer the electric charge generated in the photoelectric converting section when given respective corresponding drive signals out of the three-phase or four-phase drive signals. In this case, each of the transfer electrodes of the transfer section is given the corresponding drive signal out of the three-phase or four-phase drive signals. This allows the transfer section to transfer the electric charge bi-directionally, in the first direction or the second direction, and to transfer the electric charge at high speed.

The first buffer section may have a plurality of transfer electrodes disposed in juxtaposition in the first direction and configured to transfer the acquired electric charge when given respective corresponding drive signals out of the two-phase drive signals, and the second buffer section may have a plurality of transfer electrodes disposed in juxtaposition in the second direction and configured to transfer the acquired electric charge when given respective corresponding drive signals out of the two-phase drive signals. In this case, each of the transfer electrodes of the first buffer section and the second buffer section is given the corresponding drive signal out of the two-phase drive signals. This allows the first buffer section and the second buffer section to transfer the electric charge at high speed by the two-phase drive signals.

The device may comprise a plurality of photoelectric converting sections disposed in juxtaposition in a third direction perpendicular to the first and second directions; the transfer section, and the first and second buffer sections each may be disposed corresponding to each photoelectric converting section; the first output section may be disposed corresponding to two first buffer sections adjacent in the third direction, out of a plurality of first buffer sections, and be configured to acquire electric charges alternately transferred from the two first buffer sections adjacent in the third direction and output signals according to the respective electric charges alternately transferred; and the second output section may be disposed corresponding to two second buffer sections adjacent in the third direction, out of a plurality of second buffer sections, and be configured to output signals according to respective electric charges alternately transferred. In this case, the first output section outputs the signals according to the respective electric charges alternately transferred from the two first buffer sections adjacent in the third direction. The second output section outputs the signals according to the respective electric charges alternately transferred from the two second buffer sections adjacent in the third direction. For this reason, in a duration in which one of the two adjacent first or second buffer sections is not outputting any electric charge, the other can output the electric charge. For this reason, the electric charges can be read out at high speed, without need for a longer time for output of the electric charges.

Advantageous Effect of Invention

The present invention has provided the solid-state imaging device capable of transferring the electric charges bi-directionally and reading out the electric charges at high speed.

DESCRIPTION OF EMBODIMENTS

Embodiments of the present invention will be described below in detail with reference to the accompanying drawings. Identical elements or elements with identical functionality will be denoted by the same reference signs in the description, without redundant description.

(First Embodiment)

Figure 1:
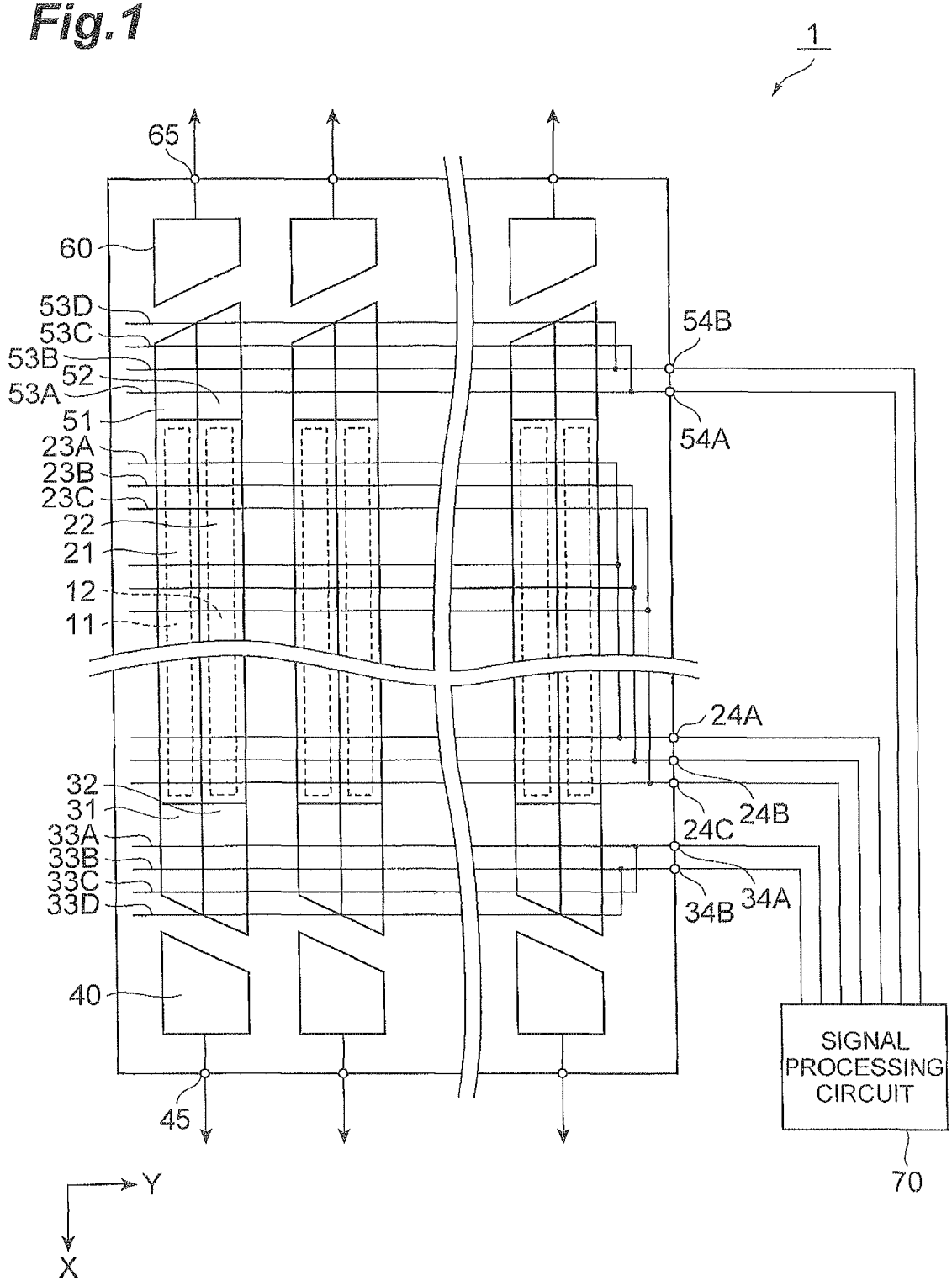
FIG. 1 is a plan view schematically showing a configuration of the solid-state imaging device according to a first embodiment of the present invention.

FIG. 1 is a drawing schematically showing the configuration of the solid-state imaging device according to the first embodiment. In the description hereinafter, the positive direction of the X-axis in FIG. 1 will be referred to as the first direction, the negative direction of the X-axis in FIG. 1 opposite to the first direction as the second direction, and the positive direction of the Y-axis in FIG. 1 perpendicular to the first direction and the second direction as the third direction as occasion may demand.

The solid-state imaging device 1 has a plurality of photoelectric converting sections 11, 12, a plurality of transfer sections 21, 22, a plurality of first buffer sections 31, 32, a plurality of second buffer sections 51, 52, a plurality of first output sections 40, and a plurality of second output sections 60.

The photoelectric converting sections 11, 12 are provided so as to extend along the positive direction of the X-axis (the first direction). The photoelectric converting sections 11, 12 generate electric charges according to intensities of incident light, in response to incidence of light. The photoelectric converting sections 11, 12 are disposed as a plurality of sections in juxtaposition along the positive direction of the Y-axis (the third direction). One photoelectric converting section 11 is disposed so as to be adjacent to one photoelectric converting section 12 in the Y-axis directions. The photoelectric converting sections 11, 1.2 are, for example, photodiodes each of which is formed by joining a p-type semiconductor layer to an n-type semiconductor layer on a semiconductor substrate.

The transfer sections 21, 22 are provided corresponding to the respective photoelectric converting sections 11, 12. The transfer sections 21, 22 extend in the X-axis directions so as to extend along the photoelectric converting sections 11, 12. The transfer sections 21, 22 transfer the electric charges generated in the photoelectric converting sections 11, 12, in the positive direction of the X-axis or in the negative direction of the X-axis (the second direction) being the opposite direction thereto, in response to three-phase or four-phase drive signals. Particularly, when, in imaging a moving object, the transfer sections 21, 22 are configured to transfer the electric charges at a transfer rate of electric charges equal to a moving speed of the object, the solid-state imaging device 1 performs the TDI operation.

The transfer sections 21, 22 have transfer electrodes 23. The transfer electrodes 23 extend in the Y-axis directions so as to bridge the upper surfaces of the photoelectric converting sections 11, 12 and are disposed in juxtaposition in the X-axis directions. The transfer electrodes 23 transfer the electric charges generated in the photoelectric converting sections 11, 12 when given respective corresponding drive signals out of the three-phase or four-phase drive signals. The transfer electrodes 23 are made of a transparent material, e.g., such as polysilicon, so as to be able to transmit light to the photoelectric converting sections 11, 12. In the present embodiment, the drive signals are three-phase signals and the transfer electrodes 23 are disposed in juxtaposition in the X-axis directions so that each set of three electrodes include transfer electrodes 23A, 23B, and 23C. A plurality of transfer electrodes 23A are connected to each other by a wire extending in the X-axis directions and connected to an input terminal 24A. Similarly, a plurality of transfer electrodes 23B are connected to each other by a wire extending in the X-axis directions and connected to an input terminal 24B. A plurality of transfer electrodes 23C are connected to each other by a wire extending in the X-axis directions and connected to an input terminal 24C. Connected to the input terminals 24A, 24B, and 24C is a signal processing circuit 70 for supplying the three-phase drive signals to the transfer electrodes 23A, 23B, and 23C. In the transfer sections 21, 22, a plurality of sets of aforementioned transfer electrodes 23A, 23B, and 23C are disposed in juxtaposition in the positive direction of the X-axis direction.

The first buffer sections 31, 32 are disposed corresponding to the photoelectric converting sections 11, 12. The first buffer sections 31, 32 are disposed so as to be adjacent to the photoelectric converting sections 11, 12 in the positive direction of the X-axis. The first buffer sections 31, 32 acquire the electric charges transferred in the positive direction of the X-axis by the transfer sections 21, 22 and transfer the acquired electric charges in the positive direction of the X-axis, in response to two-phase drive signals. In the first buffer sections 31, 32, a potential distribution is established for transferring the electric charges in the positive direction of the X-axis by the two-phase drive signals. An example of this potential distribution in the first buffer sections 31, 32 is, for example, such that a distribution of potentials in the X-axis directions is a stepped distribution in which potentials become deeper in the positive direction of the X-axis, for example, by adjustment of impurity concentrations in the semiconductor substrate.

The first buffer sections 31, 32 have transfer electrodes 33A to 33D disposed in juxtaposition in the positive direction of the X-axis. The transfer electrodes 33A to 33D extend in the Y-axis directions. The transfer electrode 33A and the transfer electrode 33C are connected to each other by a wire extending in the X-axis directions and connected to an input terminal 34A. The transfer electrode 33B and the transfer electrode 33D are connected to each other by a wire extending in the X-axis directions and connected to an input terminal 34B. The transfer electrodes 33A to 33D transfer the electric charges acquired from the photoelectric converting sections 11, 12, when given respective corresponding drive signals out of the two-phase drive signals. The transfer electrodes 33A to 33D are made of a transparent material, e.g., such as polysilicon as the transfer electrodes 23A, 23B, and 23C are.

The first output sections 40 are disposed corresponding to the first buffer sections 31, 32. The first output sections 40 are disposed so as to be adjacent to the first buffer sections 31, 32 in the positive direction of the X-axis. More specifically, each first output section 40 is disposed corresponding to the first buffer sections 31, 32 adjacent in the Y-axis directions. The first output section 40 acquires the electric charges alternately transferred from these corresponding first buffer sections 31, 32 and outputs signals according to the respective electric charges alternately transferred. The first output sections 40 acquire the electric charges transferred from the first buffer sections 31, 32 and output signals according to the acquired electric charges. The signals output from the first output sections 40 are, for example, voltage signals but may be other signals, e.g., such as current signals as long as they are signals according to the electric charges. The first output sections 40 output the signals via output terminals 45.

The second buffer sections 51, 52 are disposed corresponding to the photoelectric converting sections 11, 12. The second buffer sections 51, 52 are disposed so as to be adjacent to the photoelectric converting sections 11, 12 in the negative direction of the X-axis. The second buffer sections 51, 52 acquire the electric charges transferred in the negative direction of the X-axis by the transfer sections 21, 22 and transfer the acquired electric charges in the negative direction of the X-axis, in response to two-phase drive signals. In the second buffer sections 51, 52, a potential distribution is established for transferring the electric charges in the negative direction of the X-axis by the two-phase drive signals. An example of this potential distribution in the second buffer sections 51, 52 is, for example, such that a distribution of potentials in the X-axis directions is a stepped distribution in which potentials become deeper in the negative direction of the X-axis, for example, by adjustment of impurity concentrations in the semiconductor substrate.

The second buffer sections 51, 52 have transfer electrodes 53A to 53D disposed in juxtaposition in the negative direction of the X-axis. The transfer electrodes 53A to 53D extend in the Y-axis directions. The transfer electrode 53A and the transfer electrode 53C are connected to each other by a wire extending in the X-axis directions and connected to an input terminal 54A. The transfer electrode 53B and the transfer electrode 53D are connected to each other by a wire extending in the X-axis directions and connected to an input terminal 54B. The transfer electrodes 53A to 53D transfer the electric charges acquired from the photoelectric converting sections 11, 12, when given respective corresponding drive signals out of the two-phase drive signals. The transfer electrodes 53A to 53D are made of a transparent material, e.g., such as polysilicon as the transfer electrodes 23A, 23B, and 23C are.

Figure 2:
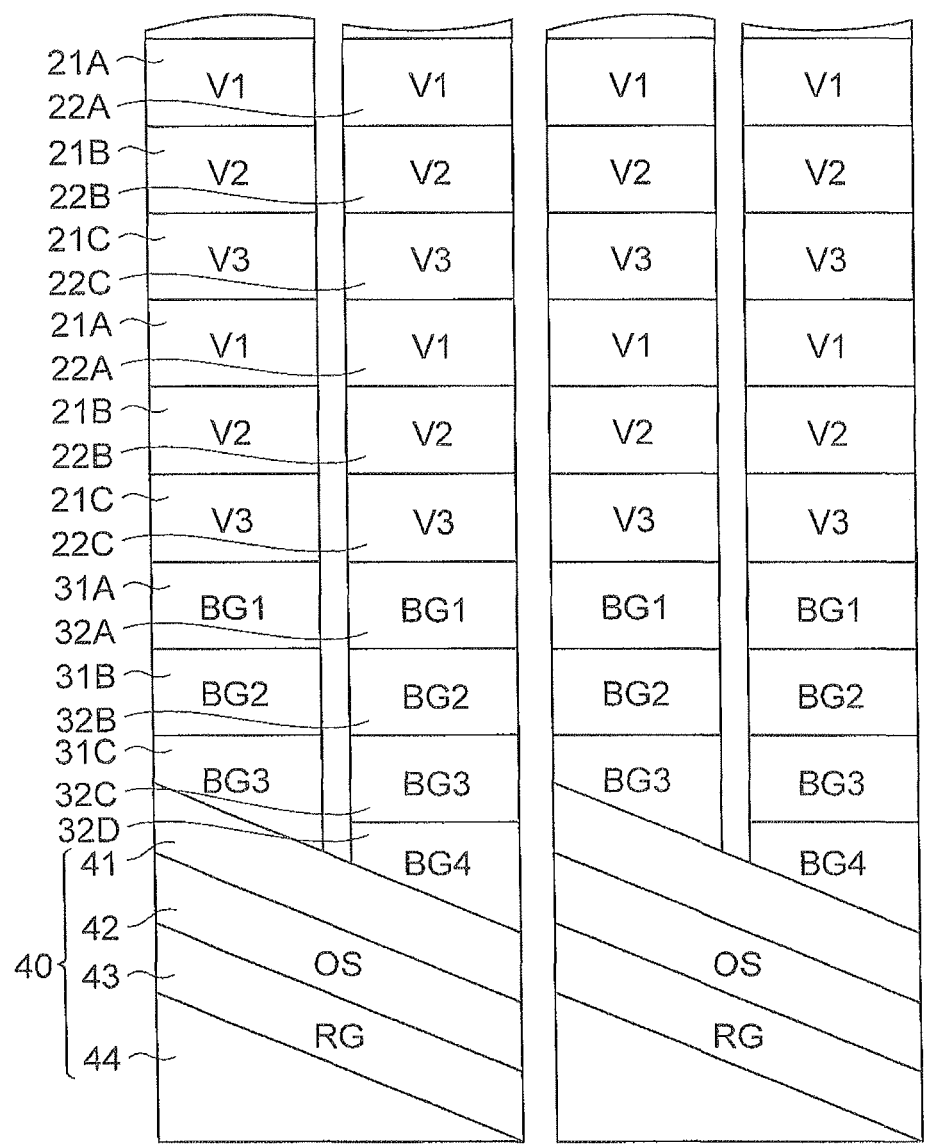
FIG. 2 is a plan view schematically showing transfer sections, first buffer sections, and first output sections in the solid-state imaging device according to the first embodiment of the present invention.

FIG. 2 shows an enlarged view of the end portions of the transfer sections 21, 22 in the positive direction of the X-axis, the first buffer sections 31, 32, and the first output sections 40.

Portions 21A, 22A are portions of the transfer sections 21, 22, respectively, located below the transfer electrodes 23A. Portions 21B, 22B are portions of the transfer sections 21, 22, respectively, located below the transfer electrodes 23B. Portions 21C, 22C are portions of the transfer sections 21, 22, respectively, located below the transfer electrodes 23C.

Portions 31A, 32A are portions of the first buffer portions 31, 32, respectively, located below the transfer electrode 33A. Portions 31B, 32B are portions of the first buffer portions 31, 32, respectively, located below the transfer electrode 33B. Portions 31C, 32C are portions of the first buffer portions 31, 32, respectively, located below the transfer electrode 33C. Portion 32D is a portion of the first buffer section 32 located below the transfer electrode 33D.

It is noted herein that a border between the first buffer sections 31, 32 and the first output section 40 is inclined relative to the Y-axis. The first buffer sections 32 are provided so as to be longer in the X-axis directions than the first buffer sections 31.

Each first output section 40 has an output gate 41, a floating diffusion 42, a reset gate 43, and a reset drain 44.

The output gate 41 is an electrode to which a voltage is applied as a drive signal for transferring electric charges stored in the portions 31C, 32D, to the floating diffusion 42.

The floating diffusion 42 is a portion that receives the electric charges stored in the portions 31C, 32D. The floating diffusion 42 is, for example, a semiconductor layer obtained by diffusion of an n-type impurity, on the semiconductor substrate. When the floating diffusion 42 receives an electric charge from the portion 31C or 32D, an electric potential of the floating diffusion 42 turns to an electric potential proportional to the received electric charge. The floating diffusion 42 is connected to an input terminal of an unshown output circuit (e.g., a gate terminal of a source follower circuit) and an output terminal of this output circuit is connected to the output terminal 45.

The reset gate 43 is an electrode to which a reset signal RG is applied. The reset gate 43 is an electrode that causes a short circuit between the reset train 44 and the floating diffusion 42 in response to the reset signal RG to reset the electric potential of the floating diffusion 42 to the electric potential of the reset drain 44.

The reset drain 44 is, for example, a semiconductor layer obtained by diffusion of an n-type impurity on the semiconductor substrate. The reset drain 44 is connected to a reference electric potential (e.g., the ground potential) kept constant against time.

Figure 3:
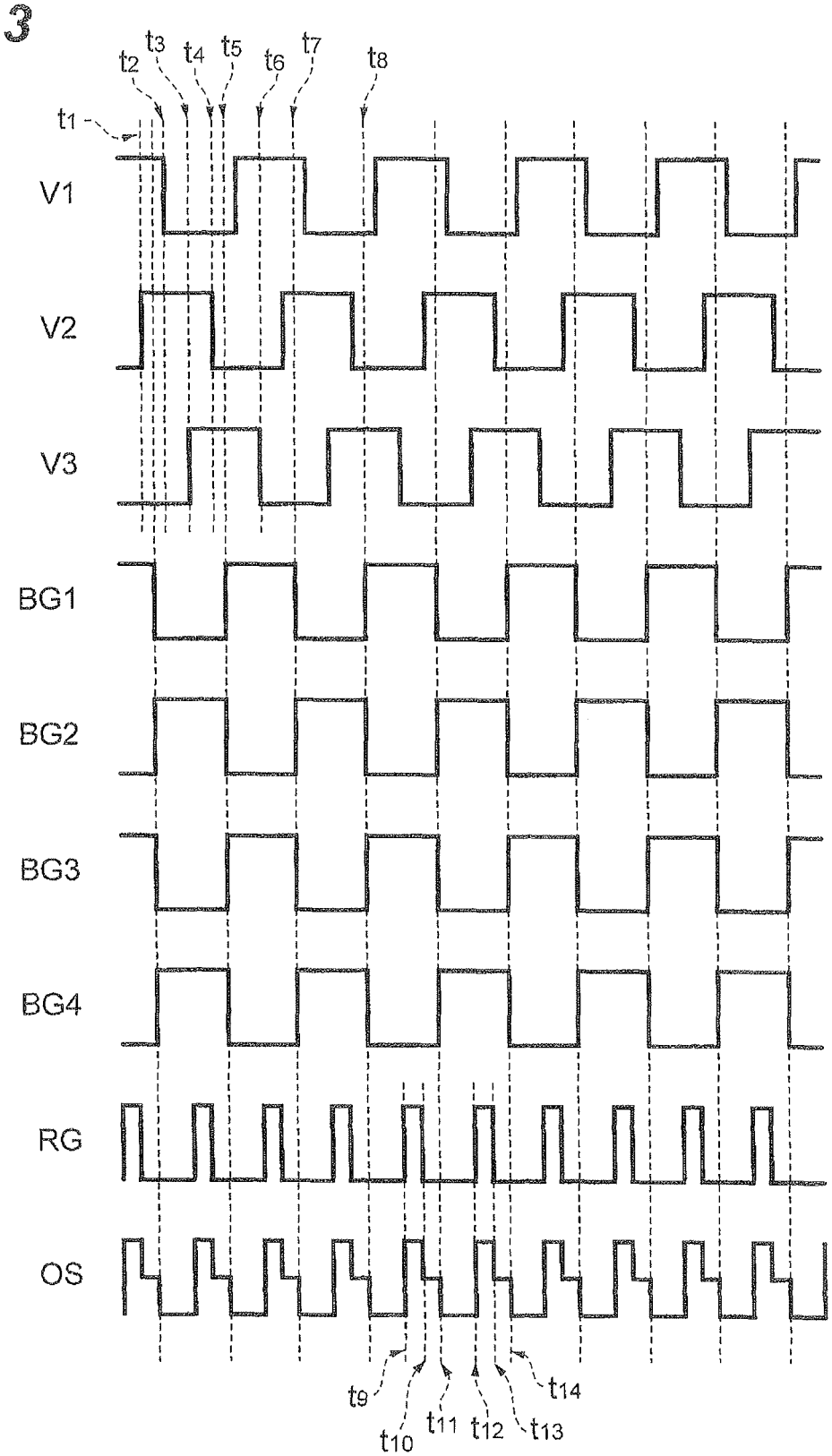
FIG. 3 is a timing chart showing voltages applied in transfer of electric charges in the first direction in the solid-state imaging device according to the first embodiment of the present invention.

The following will describe the operation of the solid-state imaging device 1 in the case where the electric charges are transferred in the positive direction of the X-axis, using the three-phase drive signals, with reference to FIG. 3. In the description hereinafter, the voltages as the drive signals applied to the transfer electrodes 23A, 23B, and 23C will be denoted by V1, V2, and V3, respectively. The voltages as the drive signals applied to the transfer electrodes 33A, 33B, 33C, and 33D will be denoted by BG1, BG2, BG3, and BG4, respectively. The voltage applied to the reset gate 43 will be denoted by RG and the electric potential of the floating diffusion 42 by OS.

First, before time $t_1$, the voltage V1 is H level, the voltage V2 is L level, and the voltage V3 is L level. At this time, the potentials of the portions 21A, 22A are deep and the potentials of the portions 21B, 22B, 21C, 22C are shallow. For this reason, the electric charges are stored in the portions 21A, 22A.

At time $t_1$, the voltage V2 is turned to H level, whereupon the potentials of the portions 21B, 22B become deeper. This causes part of the electric charges stored in the portions 21A, 22A to be transferred to the portions 21B, 22B.

At time $t_2$, the voltage V1 is turned to L level, whereupon the potentials of the portions 21A, 22A become shallower. This causes all the electric charges stored in the portions 21A, 22A to be transferred to the portions 21B, 22B.

At time $t_3$, the voltage V3 is turned to H level, whereupon the potentials of the portions 21C, 22C become deeper. This causes part of the electric charges stored in the portions 21B, 22B to be transferred to the portions 21C, 22C.

At time $t_4$, the voltage V2 is turned to L level, whereupon the potentials of the portions 21B, 22B become shallower. This causes all the electric charges stored in the portions 21B, 22B to be transferred to the portions 21C, 22C.

At time $t_5$, the voltage BG1 is turned to H level, whereupon the potentials of the portions 31A, 32A become deeper. This causes part of the electric charges stored in the portions 21C, 22C to be transferred to the portions 31A, 32A.

At time $t_6$, the voltage V3 is turned to L level, whereupon the potentials of the portions 21C, 22C become shallower. This causes all the electric charges stored in the portions 21C, 22C to be transferred to the portions 31A, 32A.

At time $t_7$, the voltage BG1 is turned to L level and the voltage BG2 is turned to H level, whereupon the potentials of the portions 31A, 32A become shallower and the potentials of the portions 31B, 32B become deeper. This causes all the electric charges stored in the portions 31A, 32A to be transferred to the portions 31B, 32B.

At time $t_8$, the voltage BG2 is turned to L level and the voltage BG3 is turned to H level, whereupon the potentials of the portions 31B, 32B become shallower and the potentials of the portions 31C, 32C become deeper. This causes all the electric charges stored in the portions 31B, 32B to be transferred to the portions 31C, 32C.

At time $t_9$, the voltage RG is turned to H level. This causes the electric potential of the floating diffusion 42 to be reset to the same electric potential as the electric potential of the reset drain 44.

At time $t_{10}$, the voltage RG is turned to L level. This causes the electric potential of the floating diffusion 42 to be brought to an electric potential without any electric charge.

At time $t_{11}$, the voltage BG3 is turned to L level and the voltage BG4 is turned to H level, whereupon the potentials of the portions 31C, 32C become shallower and the potential of the portion 32D become deeper. This causes the electric charge stored in the portion 31C to be transferred to the floating diffusion 42 and the electric charge stored in the portion 32C to be transferred to the portion 32D. It results in changing the electric potential of the floating diffusion 42 to an electric potential corresponding to the electric charge transferred by the transfer section 21 and the first buffer section 31.

At time $t_{12}$, the voltage RG is turned to H level. This causes the electric potential of the floating diffusion 42 to be reset to the same electric potential as the electric potential of the reset drain 44.

At time $t_{13}$, the voltage RG is turned to L level. This causes the electric potential of the floating diffusion 42 to be brought to the electric potential without any electric charge.

At time $t_{14}$, the voltage BG4 is turned to L level, whereupon the potential of the portion 32D becomes shallower. This causes the electric charge stored in the portion 32D to be transferred to the floating diffusion 42. It results in changing the electric potential of the floating diffusion 42 to an electric potential corresponding to the electric charge transferred by the transfer section 22 and the first buffer section 32.

In the above description, as described in the part from the time $t_9$ to the time $t_{14}$, the first output section 40 acquires the electric charges alternately transferred from the two first buffer portions 31, 32 adjacent in the Y-axis directions and outputs the signals according to the respective electric charges alternately transferred.

Figure 4:
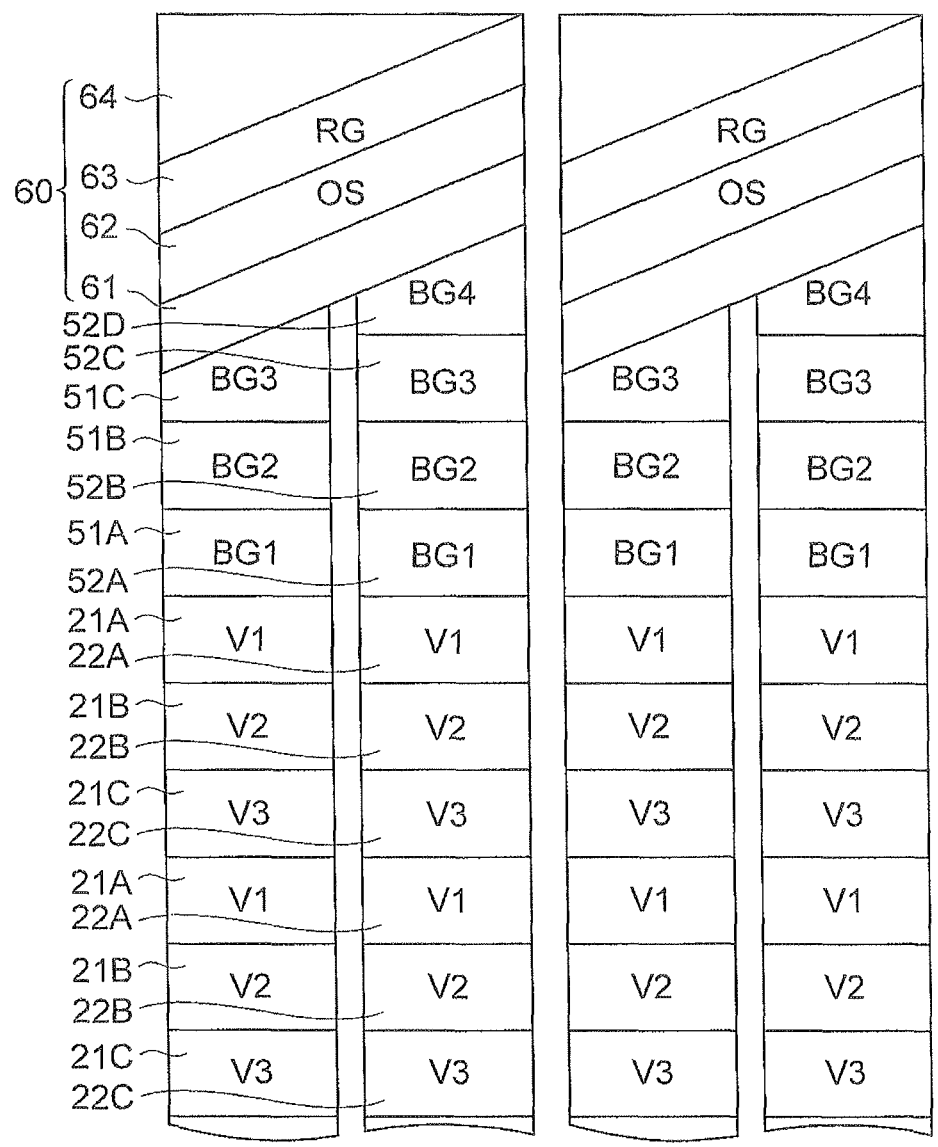
FIG. 4 is a plan view schematically showing transfer sections, second buffer sections, and second output sections in the solid-state imaging device according to the first embodiment of the present invention.

Next, FIG. 4 shows an enlarged view of the end portions of the transfer sections 21, 22 in the negative direction of the X-axis, the second buffer sections 51, 52, and the second output sections 60. Concerning the portions 21A to 23A, 21B to 23B, the description thereof is the same as the above description with reference to FIG. 2.

Portions 51A, 52A are portions of the second buffer portions 51, 52, respectively, located below the transfer electrode 53A. Portions 51B, 52B are portions of the second buffer portions 51, 52, respectively, located below the transfer electrode 53B. Portions 51C, 52C are portions of the second buffer portions 51, 52, respectively, located below the transfer electrode 53C. Portion 52D is a portion of the second buffer section 52 located below the transfer electrode 53D.

It is noted herein that a border between the second buffer sections 51, 52 and the second output section 60 is inclined relative to the Y-axis. The second buffer sections 52 are provided so as to be longer in the X-axis directions than the second buffer sections 51.

Each second output section 60 has an output gate 61, a floating diffusion 62, a reset gate 63, and a reset drain 64. The configuration of the second output section 60 is different from that of the first output section 40, in that it is disposed in the opposite direction with respect to the X-axis directions, but is the same in the other respects.

Figure 5:
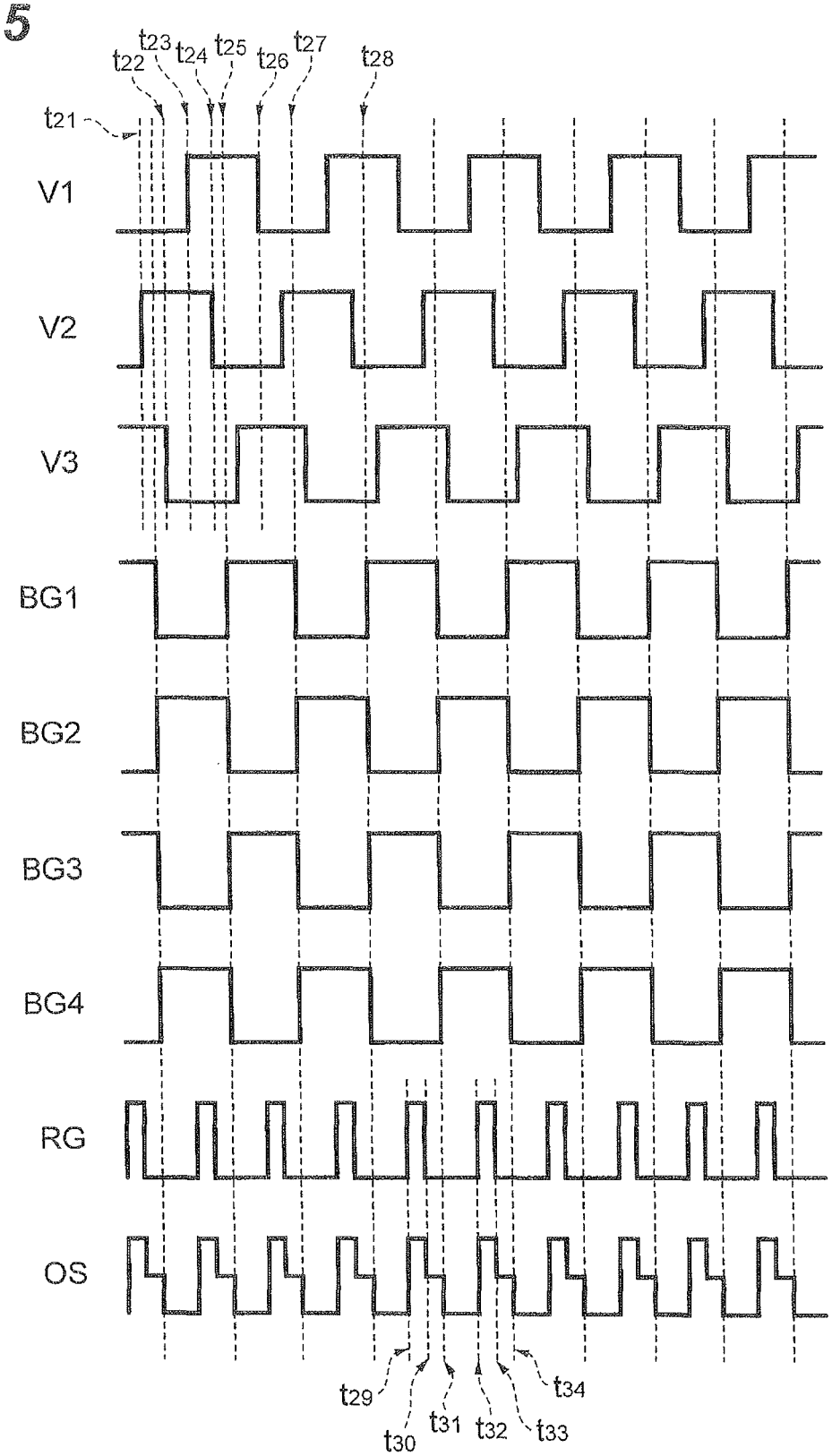
FIG. 5 is a timing chart showing voltages applied in transfer of electric charges in the second direction in the solid-state imaging device according to the first embodiment of the present invention.

The below will describe the operation of the solid-state imaging device 1 in the case where the electric charges are transferred in the negative direction of the X-axis, using the three-phase drive signals, with reference to FIG. 5. In the description hereinafter, the voltages as the drive signals applied to the transfer electrodes 23A, 23B, and 23C will be denoted by V1, V2, and V3, respectively. The voltages as the drive signals applied to the transfer electrodes 53A, 53B, 53C, and 53D will be denoted by BG1, BG2, BG3, and BG4, respectively. The voltage applied to the reset gate 63 will be denoted by RG and the electric potential of the floating diffusion 62 by OS.

First, before time $t_{21}$, the voltage V1 is L level, the voltage V2 is L level, and the voltage V3 is H level. At this time, the potentials of the portions 21A, 22A, 21B, and 22B are shallow and the potentials of the portions 21C, 22C are deep. For this reason, the electric charges are stored in the portions 21C, 22C.

At time $t_{21}$, the voltage V2 is turned to H level, whereupon the potentials of the portions 21B, 22B become deeper. This causes part of the electric charges stored in the portions 21C, 22C to be transferred to the portions 21B, 22B.

At time $t_{22}$, the voltage V3 is turned to L level, whereupon the potentials of the portions 21C, 22C become shallower. This causes all the electric charges stored in the portions 21C, 22C to be transferred to the portions 21B, 22B.

At time $t_{23}$, the voltage V1 is turned to H level, whereupon the potentials of the portions 21A, 22A become deeper. This causes part of the electric charges stored in the portions 21B, 22B to be transferred to the portions 21A, 22A.

At time $t_{24}$, the voltage V2 is turned to L level, whereupon the potentials of the portions 21B, 22B become shallower. This causes all the electric charges stored in the portions 21B, 22B to be transferred to the portions 21A, 22A.

At time $t_{25}$, the voltage BG1 is turned to H level, whereupon the potentials of the portions 51A, 52A become deeper. This causes part of the electric charges stored in the portions 21A, 22A to be transferred to the portions 51A, 52A.

At time $t_{26}$, the voltage V1 is turned to L level, whereupon the potentials of the portions 21A, 22A become shallower. This causes all the electric charges stored in the portions 21A, 22A to be transferred to the portions 51A, 52A.

At time $t_{27}$, the voltage BG1 is turned to L level and the voltage BG2 is turned to H level, whereupon the potentials of the portions 51A, 52A become shallower and the potentials of the portions 51B, 52B become deeper. This causes all the electric charges stored in the portions 51A, 52A to be transferred to the portions 51B, 52B.

At time $t_{28}$, the voltage BG2 is turned to L level and the voltage BG3 is turned to H level, whereupon the potentials of the portions 51B, 52B become shallower and the potentials of the portions 51C, 52C become deeper. This causes all the electric charges stored in the portions 51B, 52B to be transferred to the portions 51C, 52C.

At time $t_{29}$, the voltage RG is turned to H level. This causes the electric potential of the floating diffusion 62 to be reset to the same electric potential as the electric potential of the reset drain 64.

At time $t_{30}$, the voltage RG is turned to L level. This causes the electric potential of the floating diffusion 62 to be brought to the electric potential without any electric charge.

At time $t_{31}$, the voltage BG3 is turned to L level and the voltage BG4 is turned to H level, whereupon the potentials of the portions 51C, 52C become shallower and the potential of the portion 52D become deeper. This causes the electric charge stored in the portion 51C to be transferred to the floating diffusion 62 and the electric charge stored in the portion 52C to be transferred to the portion 52D. It results in changing the electric potential of the floating diffusion 62 to an electric potential corresponding to the electric charge transferred by the transfer section 21 and the second buffer section 51.

At time $t_{32}$, the voltage RG is turned to H level. This causes the electric potential of the floating diffusion 62 to be reset to the same electric potential as the electric potential of the reset drain 64.

At time $t_{33}$, the voltage RG is turned to L level. This causes the electric potential of the floating diffusion 62 to be brought to the electric potential without any electric charge.

At time $t_{34}$, the voltage BG4 is turned to L level, whereupon the potential of the portion 52D becomes shallower. This causes the electric charge stored in the portion 51D to be transferred to the floating diffusion 62. It results in changing the electric potential of the floating diffusion 62 to an electric potential corresponding to the electric charge transferred by the transfer section 22 and the second buffer section 52.

In the above description, as described in the part from the time $t_{29}$ to the time $t_{34}$, the second output section 60 acquires the electric charges alternately transferred from the two second buffer portions 51, 52 adjacent in the Y-axis directions and outputs the signals according to the respective electric charges alternately transferred.

In the solid-state imaging device 1 of the present embodiment, as described above, the electric charges generated in the photoelectric converting sections 11, 12 are transferred hi-directionally, in the positive direction of the X-axis or the negative direction of the X-axis, by the transfer sections 21, 22. The transfer sections 21, 22 transfer the electric charges in response to the three-phase or four-phase drive signals and, the first buffer sections 31, 32 or the second buffer sections 51, 52 each transfer the electric charges in response to the two-phase drive signals. Therefore, the solid-state imaging device 1 of the present embodiment can perform the transfer of the electric charges in the X-axis directions at high speed. In this manner, the solid-state imaging device 1 of the present embodiment can transfer the electric charges hi-directionally and read out the electric charges at high speed.

In the present embodiment, the transfer sections 21, 22 have the plurality of transfer electrodes 23A to 23C disposed in juxtaposition in the X-axis directions. The plurality of transfer electrodes 23A to 23C are given the respective corresponding drive signals out of the three-phase or four-phase drive signals, so as to transfer the electric charges generated in the photoelectric converting sections 11, 12. This causes the plurality of transfer electrodes 23A to 23C of the transfer sections 21, 22 to be given the respective corresponding drive signals out of the three-phase or four-phase drive signals. It allows the transfer sections 21, 22 to transfer the electric charges bi-directionally, in the positive direction of the X-axis or the negative direction of the X-axis, and to transfer the electric charges at high speed.

In the present embodiment, the first buffer sections 31, 32 may have the plurality of transfer electrodes 33A to 33D that are disposed in juxtaposition in the X-axis directions and that are given the respective corresponding drive signals out of the two-phase drive signals, so as to transfer the acquired electric charges. The second buffer sections 51, 52 may have the plurality of transfer electrodes 53A to 53D that are disposed in juxtaposition in the X-axis directions and that are given the respective corresponding drive signals out of the two-phase drive signals, so as to transfer the acquired electric charges. In this case, the corresponding drive signal out of the two-phase drive signals is given to each of the plurality of transfer electrodes 33A-33D, 53A-53D which the first buffer sections 31, 32 and the second buffer sections 51, 52 have. It allows the first buffer sections 31, 32 and the second buffer sections 51, 52 to transfer the electric charges at high speed by the two-phase drive signals.

In the present embodiment, the device has the plurality of photoelectric converting sections 11, 12 disposed in juxtaposition in the Y-axis directions perpendicular to the X-axis directions. The transfer sections 21, 22, the first buffer sections 31, 32, and the second buffer sections 51, 52 each are disposed corresponding to the respective photoelectric converting sections 11, 12. Each first output section 40 is disposed corresponding to the two first buffer sections 31, 32 adjacent in the Y-axis directions, out of the plurality of first buffer sections 31, 32. The first output section 40 acquires the electric charges alternately transferred from the two first buffer sections 31, 32 adjacent in the Y-axis directions, and outputs the signals according to the respective electric charges alternately transferred. Each second output section 60 is disposed corresponding to the two second buffer sections 51, 52 adjacent in the Y-axis directions, out of the plurality of second buffer sections 51, 52. The second output section 60 outputs the signals according to the respective electric charges alternately transferred. In this manner, the second output section 60 outputs the signals according to the respective electric charges alternately transferred from the two first buffer sections 31, 32 adjacent in the Y-axis directions. The second output section 60 outputs the signals according to the respective electric charges alternately transferred from the two second buffer sections 51, 52 adjacent in the Y-axis directions. For this reason, in a duration in which one of the two adjacent first buffer sections 31, 32 or second buffer sections 51, 52 is not outputting any electric charge, the other can output the electric charge. For this reason, the electric charges can be read out at high speed, without need for a longer time for output of the electric charges.

(Second Embodiment)

The solid-state imaging device 101 of the second embodiment is different in the number of phases of the drive signals for the transfer sections, from the solid-state imaging device 1 of the first embodiment. Namely, the transfer sections 21 in the first embodiment were configured to transfer the electric charges in response to the three-phase drive signals, whereas the transfer sections 121 in the second embodiment are configured to transfer the electric charges in response to four-phase drive signals.

Figure 6:
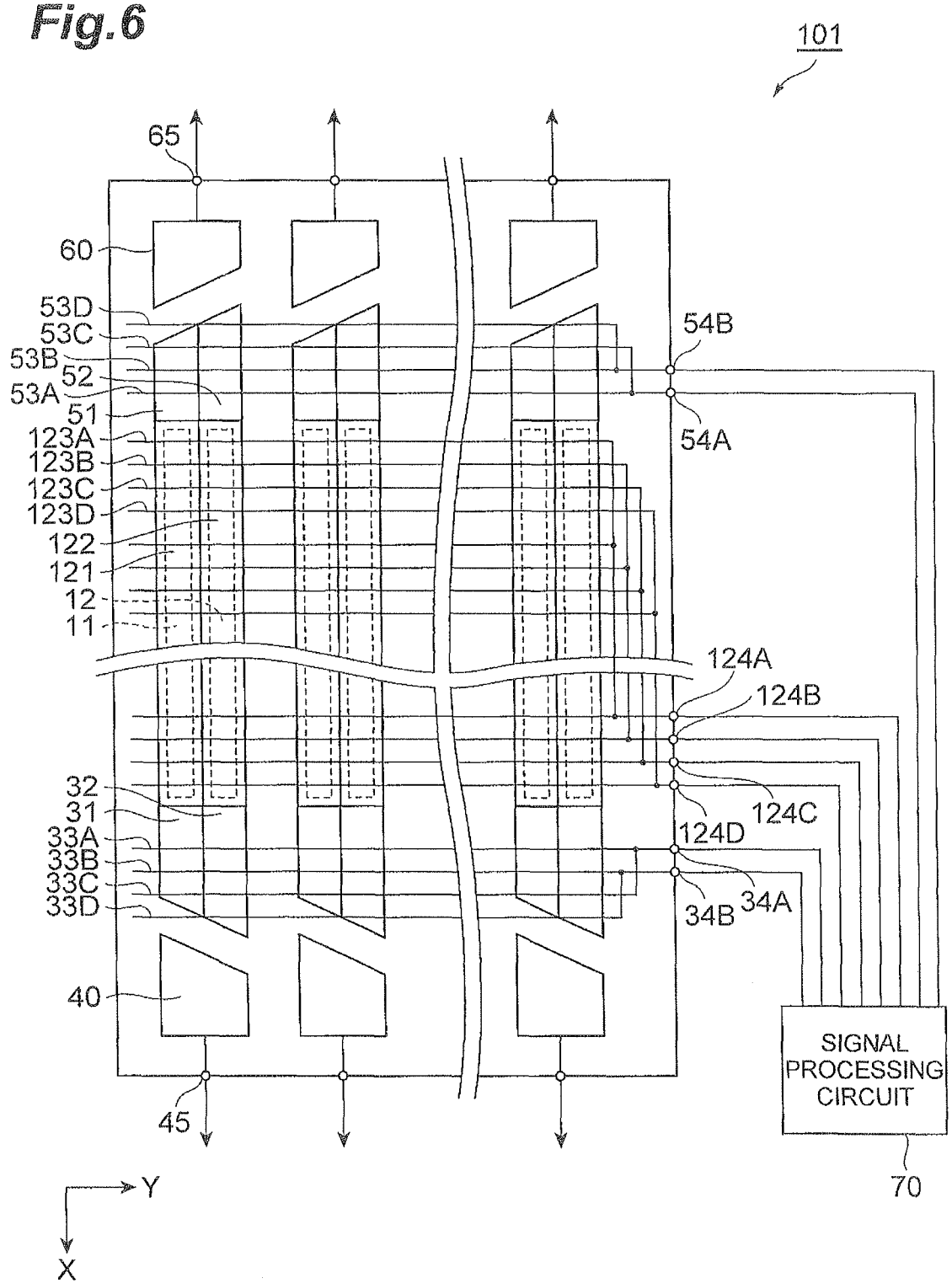
FIG. 6 is a plan view schematically showing a configuration of the solid-state imaging device according to a second embodiment of the present invention.

As shown in FIG. 6, the solid-state imaging device 101 of the second embodiment has much the same configuration as the solid-state imaging device 1 of the first embodiment shown in FIG. 1, except for the transfer sections 121. Specifically, each transfer section 121, 122 has four transfer electrodes 123A to 123D, instead of the three transfer electrodes 23A to 23C.

Figure 7:
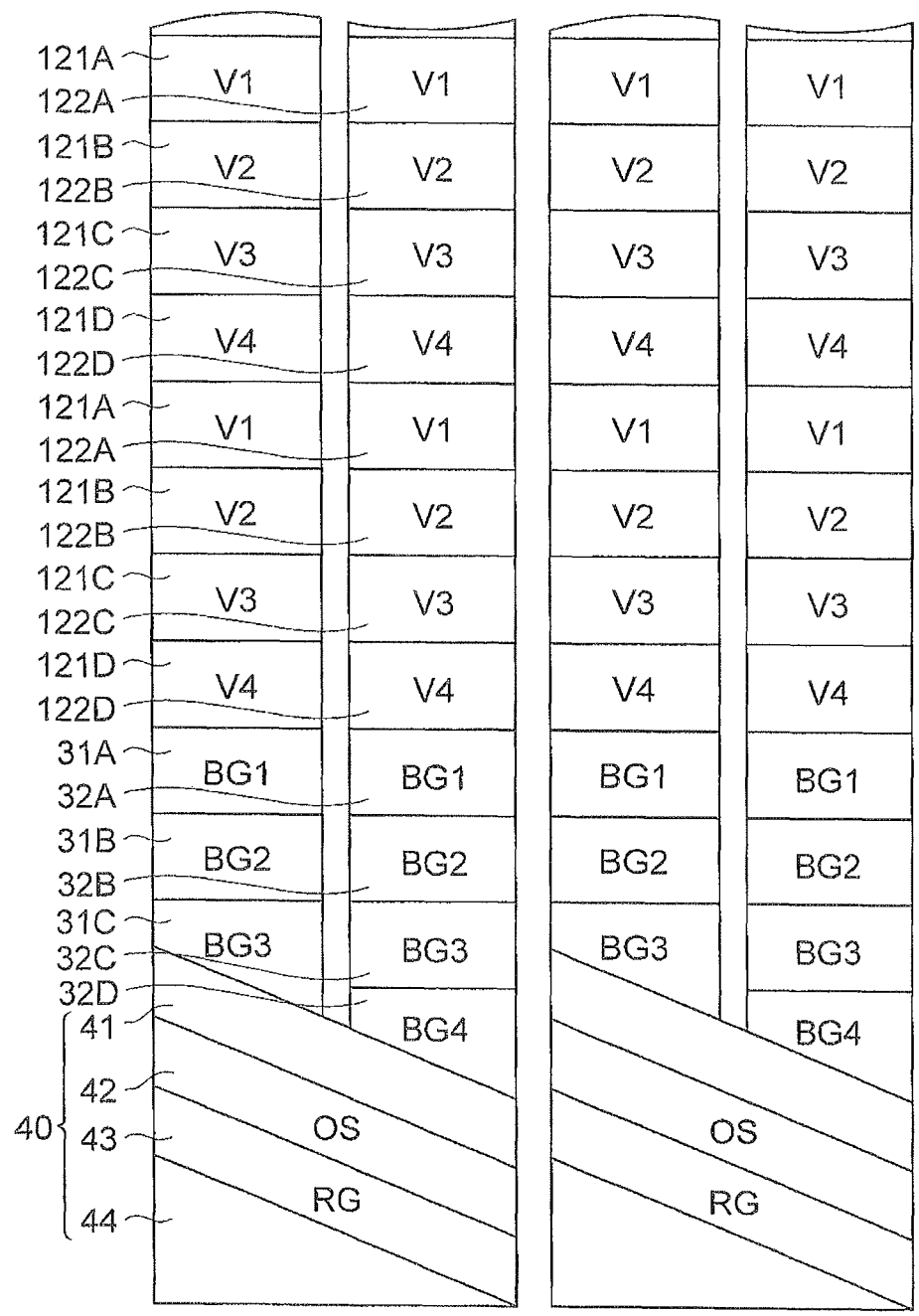
FIG. 7 is a plan view schematically showing transfer sections, first buffer sections, and first output sections in the solid-state imaging device according to the second embodiment of the present invention.

FIG. 7 shows an enlarged view of the end portions of the transfer sections 121, 122 in the positive direction of the X-axis, the first buffer sections 31, 32, and the first output sections 40 in the solid-state imaging device 101 of the second embodiment.

Portions 121A, 122A are portions of the transfer sections 121, 122, respectively, located below the transfer electrode 123A. Portions 121B, 122B are portions of the transfer sections 121, 122, respectively, located below the transfer electrode 123B. Portions 121C, 122C are portions of the transfer sections 121, 122, respectively, located below the transfer electrode 123C. Portions 121D, 122D are portions of the transfer sections 121, 122, respectively, located below the transfer electrode 123D.

Since the portions 31A-31C, 32A-32D and the first output sections 40 are the same as in the first embodiment described with reference to FIG. 2, the description thereof is omitted herein.

Figure 8:
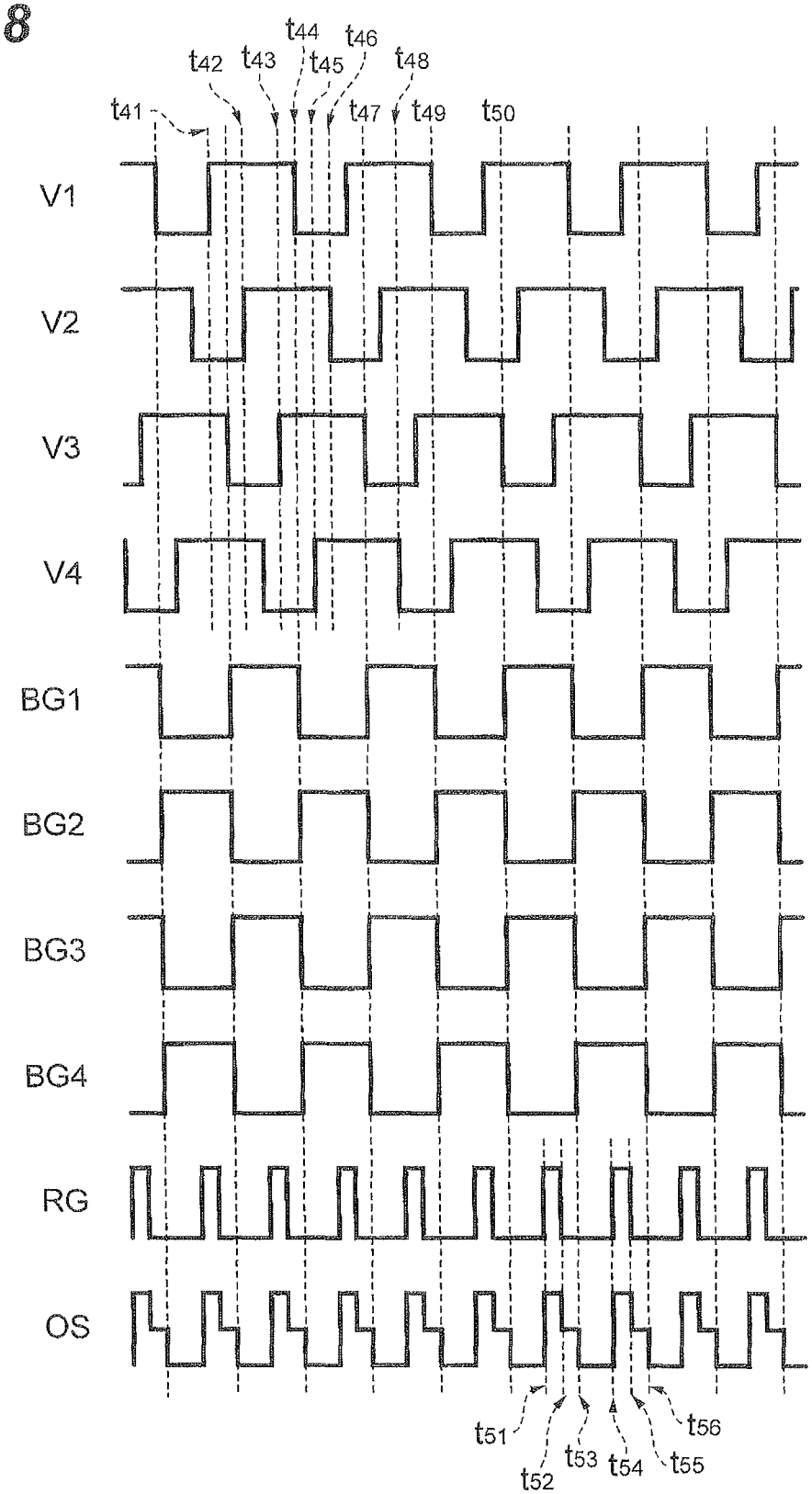
FIG. 8 is a timing chart showing voltages applied in transfer of electric charges in the first direction in the solid-state imaging device according to the second embodiment of the present invention.

The below will describe the operation of the solid-state imaging device 101 in the case where the electric charges are transferred in the positive direction of the X-axis, using the four-phase drive signals, with reference to FIG. 8. In the description hereinafter, the voltages as the drive signals applied to the transfer electrodes 123A, 123B, 123C, and 123D will be denoted by V1, V2, V3, and V4, respectively. The voltages as the drive signals applied to the transfer electrodes 33A, 33B, 33C, and 33D will be denoted by BG1, BG2, BG3, and BG4, respectively. The voltage applied to the reset gate 43 will be denoted by RG and the electric potential of the floating diffusion 42 by OS.

First, before time $t_{41}$, the voltage V1 is L level, the voltage V2 is L level, the voltage V3 is H level, and the voltage V4 is H level. At this time, the potentials of the portions 121A, 122A are shallow. For this reason, no electric charges are stored in the portions 121A, 122A.

At time $t_{41}$, the voltage V1 is turned to H level, whereupon the potentials of the portions 121A, 122A become deeper. This causes the electric charges to be transferred to the portions 121A, 122A.

At time $t_{42}$, the voltage V2 is turned to H level, whereupon the potentials of the portions 121B, 122B become deeper. This causes the electric charges to be transferred to the portions 121B, 122B.

At time $t_{43}$, the voltage V3 is turned to H level, whereupon the potentials of the portions 121C, 122C become deeper. This causes the electric charges to be transferred to the portions 121C, 122C.

At time $t_{44}$, the voltage V1 is turned to L level, whereupon the potentials of the portions 121A, 122A become shallower. This causes all the electric charges stored in the portions 121A, 122A to be transferred to the portions 121B, 122B.

At time $t_{45}$, the voltage V4 is turned to H level, whereupon the potentials of the portions 121D, 122D become deeper. This causes the electric charges to be transferred to the portions 121D, 122D.

At time $t_{46}$, the voltage V2 is turned to L level, whereupon the potentials of the portions 121B, 122B become shallower.

This causes all the electric charges stored in the portions 121B, 122B to be transferred to the portions 121C, 122C.

At time $t_{47}$, the voltage V3 is turned to L level, whereupon the potentials of the portions 121C, 122C become shallower. This causes all the electric charges stored in the portions 121C, 122C to be transferred to the portions 121D, 122D. At the same time, the voltage BG1 is turned to H level, whereupon the potentials of the portions 31A, 32A become deeper. This causes part of the electric charges stored in the portions 121D, 122D to be transferred to the portions 31A, 32A.

At time $t_{48}$, the voltage V4 is turned to L level, whereupon the potentials of the portions 121D, 122D become shallower. This causes all the electric charges stored in the portions 121D, 122D to be transferred to the portions 31A, 32A.

At time $t_{49}$, the voltage BG1 is turned to L level and the voltage BG2 is turned to H level, whereupon the potentials of the portions 31A, 32A become shallower and the potentials of the portions 31B, 32B become deeper. This causes all the electric charges stored in the portions 31A, 32A to be transferred to the portions 31B, 32B.

The operation at the times $t_{50}$ to $t_{56}$ is the same as the operation at the times $t_8$ to $t_{14}$ in the first embodiment, which was described with reference to FIG. 3, and, therefore, the description thereof is omitted herein.

The solid-state imaging device 101 of the second embodiment can also perform the transfer of electric charges in the negative direction of the X-axis, in addition to the transfer of electric charges in the positive direction of the X-axis as described above. For carrying out the transfer of electric charges in the negative direction of the X-axis, the drive voltages V4, V3, V2, and V1 shown in FIG. 8 are applied to the transfer electrodes 123A to 123D, respectively, of the transfer sections 121, 122 and the drive signals BG1 to BG4 shown in FIG. 8 are applied to the transfer electrodes 53A to 53D, respectively, of the second buffer sections 51, 52.

The solid-state imaging device 101 of the second embodiment also achieves much the same operational effect as the solid-state imaging device 1 of the first embodiment does.

The above described the embodiments of the present invention but it should be noted that the present invention is not always limited to the foregoing embodiments and can be modified in many ways without departing from the scope and spirit of the invention.

For example, in the foregoing embodiments each first output section 40 is disposed corresponding to the two adjacent first buffer sections 31, 32. However, each first output section 40 may be disposed corresponding to three or more first buffer sections, e.g., four first buffer sections 31, 32, 31, 32 or the like. Each first output section 40 may be disposed corresponding to one first buffer section 31 or first buffer section 32. The same also applies to the second buffer sections 51, 52 and the second output sections 60.

INDUSTRIAL APPLICABILITY

The present invention is applicable to the solid-state imaging devices.

REFERENCE SIGNS LIST 1, 101 solid-state imaging devices; 11, 12 photoelectric converting sections; 21, 22, 121, 122 transfer sections; 23A-23C, 33A-33D, 53A-53D, 123A-123D transfer electrodes; 31, 32 first buffer sections; 40 first output sections; 51, 52 second buffer sections; 60 second output sections.

The invention claimed is:

1. A solid-state imaging device comprising;
a photoelectric converting section provided so as to extend along a first direction and configured to generate an electric charge in response to incidence of light;
a transfer section configured to transfer the electric charge generated in the photoelectric converting section, in the first direction or in a second direction opposite to the first direction in response to three-phase or four-phase drive signals;
a first buffer section disposed corresponding to the photoelectric converting section and configured to acquire the electric charge transferred in the first direction from the photoelectric converting section by the transfer section and transfer the acquired electric charge in the first direction in response to two-phase drive signals;
a second buffer section disposed corresponding to the photoelectric converting section and configured to acquire the electric charge transferred in the second direction from the photoelectric converting section by the transfer section and transfer the acquired electric charge in the second direction in response to two-phase drive signals;
a first output section disposed corresponding to the first buffer section and configured to acquire the electric charge transferred from the first buffer section and output a signal according to the acquired electric charge;
a second output section disposed corresponding to the second buffer section and configured to acquire the electric charge transferred from the second buffer section and output a signal according to the acquired electric charge;
the photoelectric converting section and the first buffer section are adjacent to each other in the first direction;
the first buffer section and the first output section are adjacent to each other in the first direction;
the first buffer section transfers the acquired electric charge to the first output section in the first direction;
the photoelectric converting section and the second buffer section are adjacent to each other in the second direction;
the second buffer section and the second output section are adjacent to each other in the second direction; and
the second buffer section transfers the acquired electric charge to the second output section in the second direction.

2. The solid-state imaging device according to claim 1, wherein the transfer section has a plurality of transfer electrodes disposed in juxtaposition in the first direction and configured to transfer the electric charge generated in the photoelectric converting section when given respective corresponding drive signals out of the three-phase or four-phase drive signals.

3. The solid-state imaging device according to claim 1, wherein the first buffer section has a plurality of transfer electrodes disposed in juxtaposition in the first direction and configured to transfer the acquired electric charge when given respective corresponding drive signals out of the two-phase drive signals, and
wherein the second buffer section has a plurality of transfer electrodes disposed in juxtaposition in the second direction and configured to transfer the acquired electric charge when given respective corresponding drive signals out of the two-phase drive signals.

4. The solid-state imaging device according to claim 1, comprising a plurality of said photoelectric converting sections disposed in juxtaposition in a third direction perpendicular to the first and second directions, wherein the transfer section, and the first and second buffer sections each are disposed corresponding to each said photoelectric converting section, wherein the first output section is disposed corresponding to two first buffer sections adjacent in the third direction, out of a plurality of said first buffer sections, and is configured to acquire electric charges alternately transferred from the two first buffer sections adjacent in the third direction and output signals according to the respective electric charges alternately transferred, and wherein the second output section is disposed corresponding to two second buffer sections adjacent in the third direction, out of a plurality of said second buffer sections, and is configured to output signals according to respective electric charges alternately transferred.

5. A solid-state imaging device comprising:

a photoelectric converting section provided so as to extend along a first direction and configured to generate an electric charge in response to incidence of light;

a transfer section configured to transfer the electric charge generated in the photoelectric converting section, in the first direction or in a second direction opposite to the first direction in response to three-phase or four-phase drive signals;

a first buffer section disposed corresponding to the photoelectric converting section and configured to acquire the electric charge transferred in the first direction from the photoelectric converting section by the transfer section and transfer the acquired electric charge in the first direction in response to two-phase drive signals;

a second buffer section disposed corresponding to the photoelectric converting section and configured to acquire the electric charge transferred in the second direction from the photoelectric converting section by the transfer section and transfer the acquired electric charge in the second direction in response to two-phase drive signals;

a first output section disposed corresponding to the first buffer section and configured to acquire the electric charge transferred from the first buffer section and output a signal according to the acquired electric charge;

a second output section disposed corresponding to the second buffer section and configured to acquire the electric charge transferred from the second buffer section and output a signal according to the acquired electric charge;

a plurality of said photoelectric converting sections disposed in juxtaposition in a third direction perpendicular to the first and second directions, wherein the transfer section, and the first and second buffer sections each are disposed corresponding to each said photoelectric converting section, wherein the first output section is disposed corresponding to two first buffer sections adjacent in the third direction, out of a plurality of said first buffer sections, and is configured to acquire electric charges alternately transferred from the two first buffer sections adjacent in the third direction and output signals according to the respective electric charges alternately transferred, and wherein the second output section is disposed corresponding to two second buffer sections adjacent in the third direction, out of a plurality of said second buffer sections, and is configured to output signals according to respective electric charges alternately transferred.

* * * * *